United States Patent
Sano et al.

(10) Patent No.: US 7,911,786 B2
(45) Date of Patent: Mar. 22, 2011

(54) ELECTRONIC APPARATUS

(75) Inventors: Tetsuo Sano, Kobe (JP); Ryoh Ogata, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 114 days.

(21) Appl. No.: 12/385,403

(22) Filed: Apr. 7, 2009

(65) Prior Publication Data

US 2009/0257195 A1  Oct. 15, 2009

(30) Foreign Application Priority Data

Apr. 10, 2008  (JP) .................................. 2008-102868

(51) Int. Cl.
  *H05K 7/20* (2006.01)
(52) U.S. Cl. ......... 361/690; 361/703; 361/704; 361/715
(58) Field of Classification Search .......... 361/689–690, 361/715
  See application file for complete search history.

(56) References Cited

U.S. PATENT DOCUMENTS

| | | | | |
|---|---|---|---|---|
| 5,381,314 A | * | 1/1995 | Rudy et al. .................. 361/712 |
| 6,038,129 A | * | 3/2000 | Falaki et al. ................. 361/699 |
| 6,065,530 A | * | 5/2000 | Austin et al. ................. 165/80.3 |
| 6,079,486 A | * | 6/2000 | Cennamo et al. ............ 165/80.3 |
| 6,374,912 B1 | * | 4/2002 | LaGrotta et al. ............. 165/185 |
| 7,773,378 B2 | * | 8/2010 | Lin ............................... 361/690 |
| 2003/0141040 A1 | * | 7/2003 | Lee et al. ..................... 165/80.2 |
| 2008/0291627 A1 | * | 11/2008 | Fischer et al. ................ 361/697 |

FOREIGN PATENT DOCUMENTS

| | | |
|---|---|---|
| JP | A-63-213951 | 9/1988 |
| JP | 09-008483 | * 10/1997 |
| JP | A-2001-291806 | 10/2001 |
| JP | A-2004-349560 | 12/2004 |
| JP | A-2007-032535 | 2/2007 |

* cited by examiner

*Primary Examiner* — Gregory D Thompson
(74) *Attorney, Agent, or Firm* — Oliff & Berridge, PLC

(57) ABSTRACT

An electronic apparatus that includes a circuit substrate being installed in a casing. The electronic apparatus has first and second groove portions that are formed on a first surface and a second surface of a heat sink, respectively. The heat sink discharges heat from a heat element on the circuit substrate to the outside of the casing. The electronic apparatus has a through-hole portion that is formed at an intersection point of the first groove portion formed on the first surface of the heat sink and the second groove portion formed on the second surface of the heat sink.

8 Claims, 11 Drawing Sheets

ELECTRONIC APPARATUS

BACKGROUND OF THE INVENTION

1. Field of the Invention

The present invention relates to an electronic apparatus, and more particularly, to an electronic apparatus that discharges hot air generated by a heat element to the outside of a casing thereof.

2. Description of the Related Art

There have been conventionally known a structure of a casing that discharges heat generated by a heat element in the casing, and a heat sink. In the heat sink, there have been known a structure to enlarge a volume or a surface area in order to improve a heat radiation effect, and a structure to make a surface, which should be contacted to the casing, plane in order to make the surface come in contact with the casing closely.

As such a structure, for example, Japanese Patent Application Publication No. 2004-349560 (Document 1) discloses a cooling electronic apparatus in which heat parts are thermally connected to an inside surface of a wall portion of a casing which composes the cooling electronic apparatus, and an air hole is provided at the wall portion of the casing in the vicinity of the heat parts.

In Japanese Patent Application Publication No. 2001-291806 (Document 2), there has been known a technique that discharges heat generated by a CPU to the outside of a note-type personal computer by attaching an end of a heat sink to a surface of the CPU in the note-type personal computer. A plurality of heat radiation grooves are formed on the heat sink in parallel along the direction of the heat radiation.

However, in the cooling electronic apparatus of Document 1, the air hole is provided at a bottom portion of the casing. The air (i.e., the hot air) warmed with the heat parts rises, so that the hot air in the cooling electronic apparatus is not discharged easily from the air hole of the bottom portion of the casing to the outside. Also, the air warmed with the heat parts is not directly discharged outside the device, and it is therefore considered that the hot air stays easily in the cooling electronic apparatus.

In Document 2, the heat of the CPU provided in a center portion of the note-type personal computer is discharged from an opening of the outside wall of the personal computer with a metal plate (i.e., heat sink) extending to right and left. However, even in this case, the air warmed with the heat parts is not directly discharged outside the note-type personal computer, and therefore the hot air stays easily in the note-type personal computer. Also, in the note-type personal computer, a user requests the slimness thereof (e.g. 2 to 3 cm), and therefore the heat sink connecting between the CPU and the opening of the outside wall of the personal computer may be the best. However, in a device with a height that exceeds 3 cm, it is considered that the hot air stays easily in the device even in the case of the technique of Document 2.

In addition, the heat generated by the heat element is transmitted to the heat sink, the heat sink is warmed, and hence a temperature in the device rises by the heat of the heat sink. It is therefore fear that the rise in temperature has a bad influence on a low heat-resistant element.

For this reason, to discharge the hot air in the device to the outside of the device or improve cooling efficiency of the device by increasing the surface area of the heat sink, the measures to open a plurality of holes to the heat sink are considered. However, when a hole diameter of each hole opened to the heat sink is large, it is considered that the heat conductivity of the heat sink decreases and the dust-proof performance deteriorates. In addition, it is fear that the EMC (ElectroMagnetic Compatibility) performance as the electric performance deteriorates. On the contrary, when the hole diameter of each hole opened to the heat sink is small, a problem that a heat discharge effect and the heat radiation effect are not provided occurs.

SUMMARY OF THE INVENTION

The present invention has been made in view of the above circumstances and provides an electronic apparatus that is capable of discharging heat generated by a heat element to the outside of a casing efficiently, and is excellent in dust-proof performance and EMC performance.

According to an aspect of the present invention, there is provided an electronic apparatus in which a circuit substrate is installed in a casing, including: first and second groove portions that are formed on a first surface and a second surface of a heat sink, respectively, the heat sink discharging heat from a heat element on the circuit substrate to the outside of the casing; and a through-hole portion that is formed at an intersection point of the first groove portion formed on the first surface of the heat sink and the second groove portion formed on the second surface of the heat sink.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

First Embodiment

Figure 1:
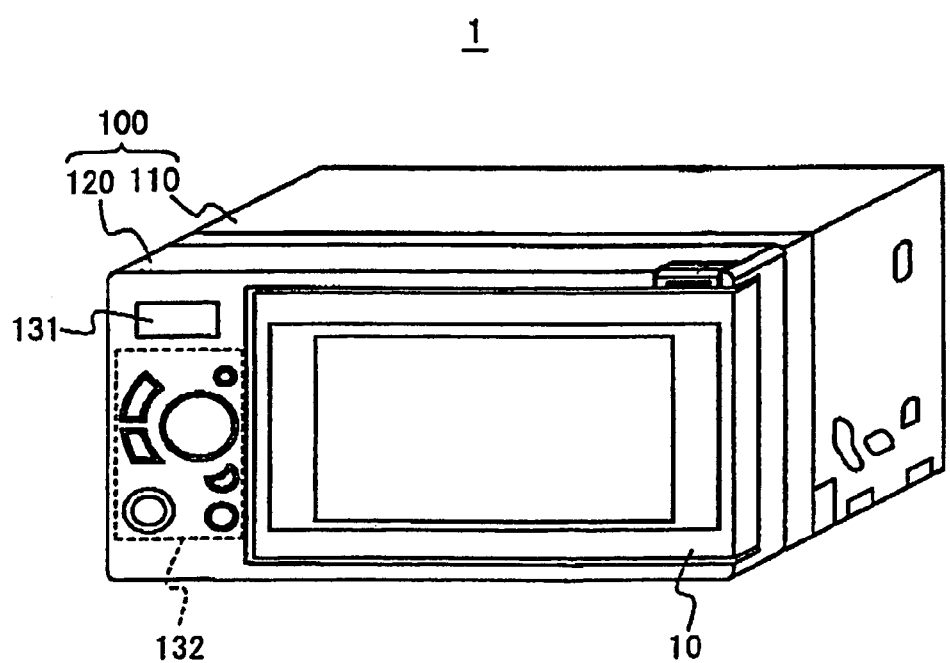
FIG. 1 is a diagram showing the appearance of an in-vehicle system.

A description will now be given of a first embodiment of the present invention with reference to the accompanying drawings. FIG. 1 is a diagram showing an appearance shape of an in-vehicle system as an example of an electronic system.

As shown in FIG. 1, an in-vehicle system 1 is composed of an in-vehicle apparatus 100 (electronic apparatus) that is installed in a vehicle, and a portable apparatus 10 (portable apparatus) including a navigation function. The portable apparatus 10 can be used after being attached at a front face portion 120 of the in-vehicle apparatus 100, and can be also used after being detached from the in-vehicle apparatus 100.

The in-vehicle apparatus 100 is capable of playing radio broadcasting or playing music data recorded on a recording medium such as a CD (Compact Disc) or the like. The in-vehicle apparatus 100 includes: a main body 110 having a player of the recording medium and an insertion/ejection slot of the recording medium; and the front face portion 120 having a display portion 131 and an operation portion 132. The portable apparatus 10 has the navigation function of searching for a guiding path to a destination and displaying the searched guiding path over a map.

Figure 2:
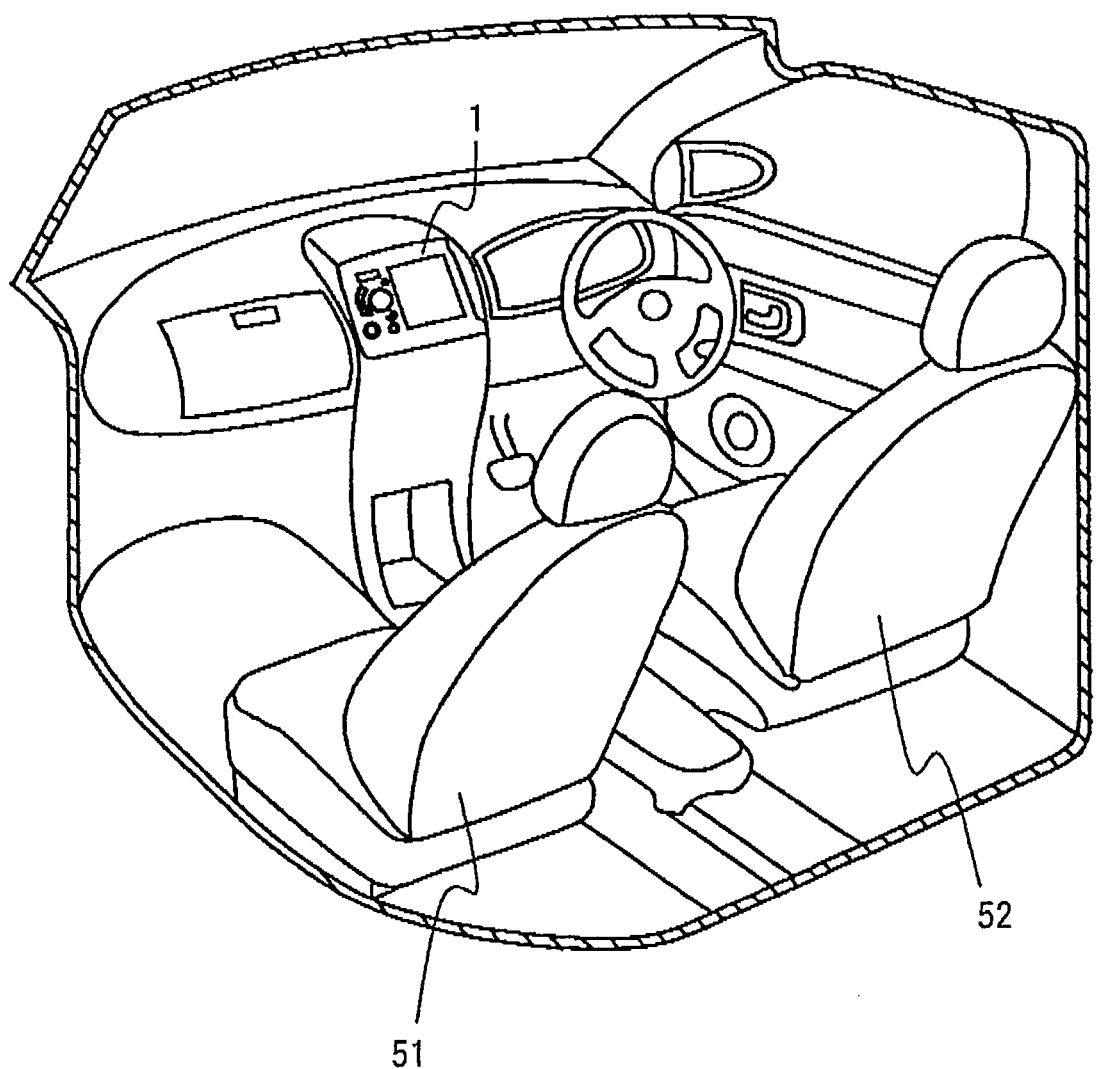
FIG. 2 is a diagram showing a state where the in-vehicle system is installed in a vehicle.

FIG. 2 is a diagram showing a state where the in-vehicle system 1 is installed in the vehicle.

The in-vehicle system 1 is disposed in a dashboard portion substantially in the middle of a front-passenger's seat 51 and a driver's seat 52, as shown in FIG. 2, for example, and is closely fit in a front instrument panel. Thus, the in-vehicle system 1 is in an airtight state, so that the heat generated from various heat elements disposed inside the in-vehicle system 1 is not discharged easily to the outside of the in-vehicle system 1.

Figure 3:
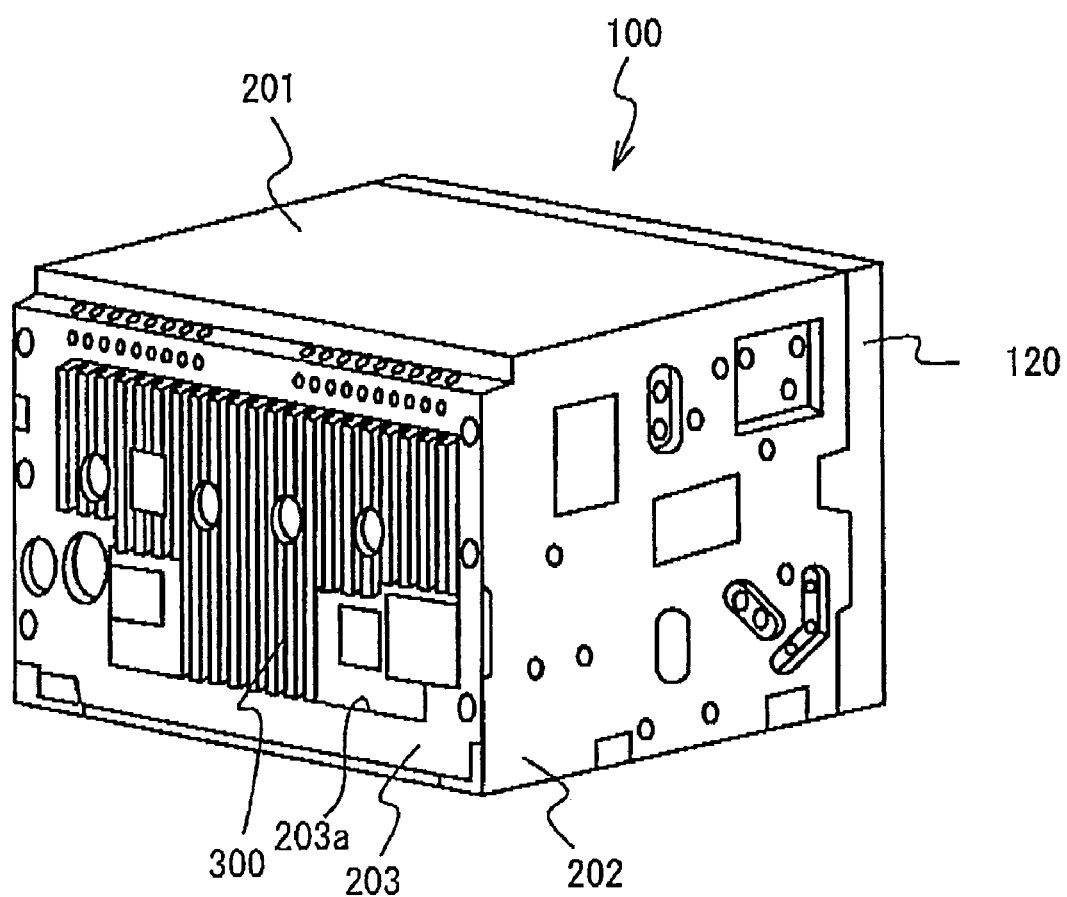
FIG. 3 is a perspective diagram showing the in-vehicle system as viewed from a rear side.

FIG. 3 is a perspective diagram showing the appearance of the in-vehicle system 1 including a heat sink 300, as viewed from a rear side.

As shown in FIG. 3, the in-vehicle system 1 is composed of a box-shape casing, and the casing includes a top panel 201, a right side panel 202, a left side panel (not shown), and a rear panel 203. Attaching plugs for a power supply, cables, or the like are provided on the rear panel 203. In addition, an opening 203a for the heat sink 300 is provided in the rear panel 203, and the heat sink 300 projects from the opening 203a.

Figure 4:
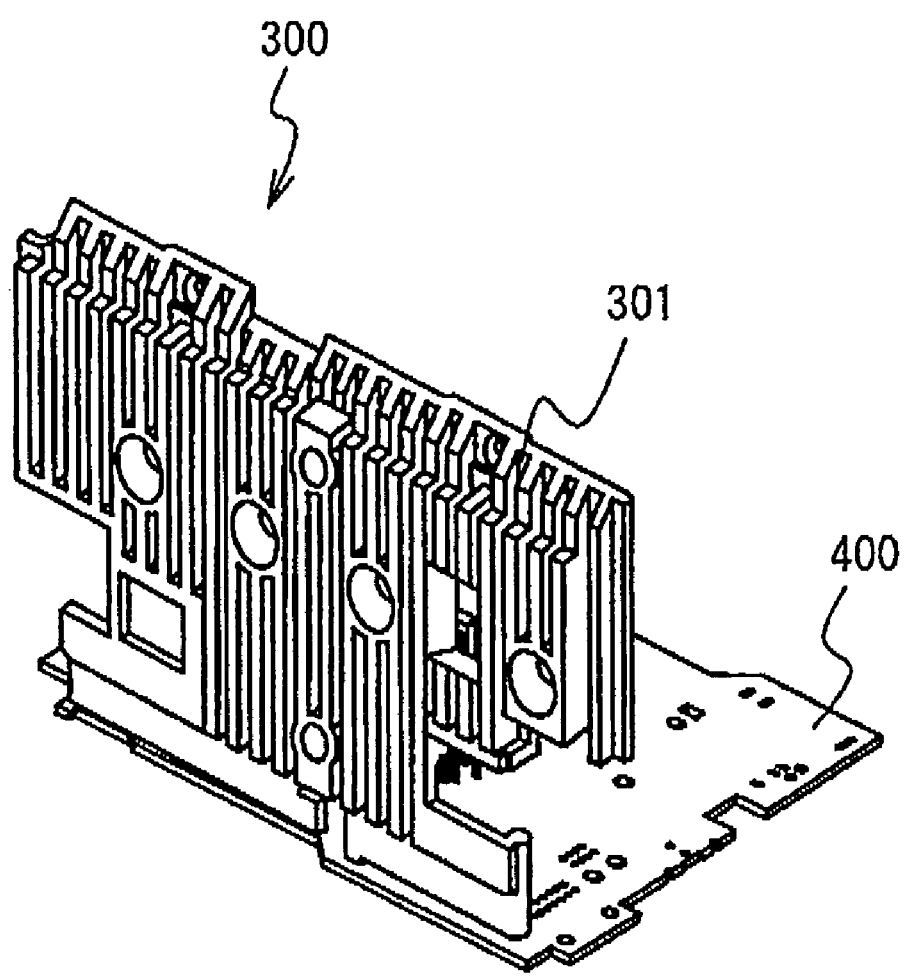
FIG. 4 is a diagram useful in explaining the arrangement of a substrate and a heat sink.

FIG. 4 is a diagram useful in explaining the arrangement of a substrate 400 and the heat sink 300.

As shown in FIG. 4, the heat sink 300 is arranged for the substrate 400 or a bottom of the casing in a vertical direction. The heat sink 300 is composed of a metal such as aluminum and copper, or a material with high heat conductivity such as ceramic and carbon, for example. On an surface of the heat sink 300 which is directed to an outside direction of a casing (the surface will hereinafter be referred to as "outside face"), a plurality of groove portions 301 are formed. The groove portions 301 are arranged so as to get some air.

Figure 5:
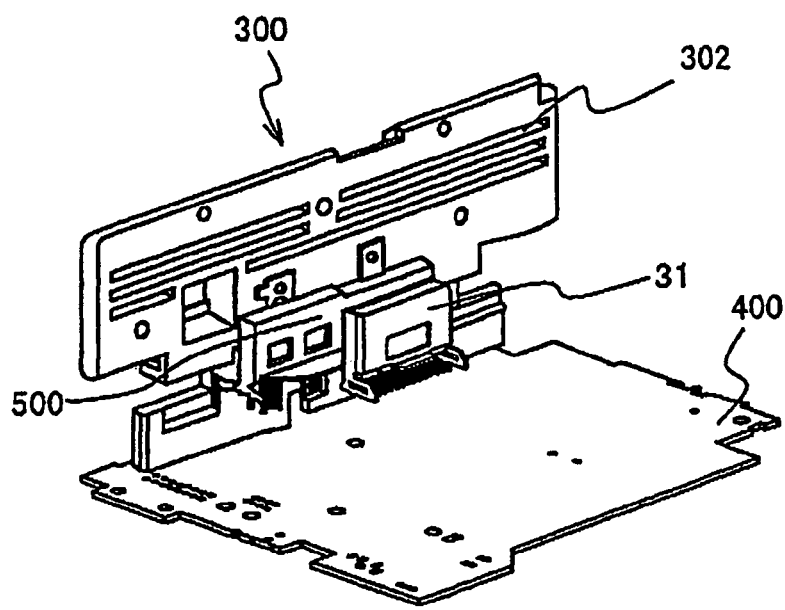
FIG. 5 is a diagram useful in explaining a state where a heat element is mounted on the heat sink and the substrate.

FIG. 5 is a diagram useful in explaining a state where a heat element 31 is mounted on the heat sink 300.

As shown in FIG. 5, the heat element 31 is provided on a lower side of the heat sink 300. The heat element 31 is bonded to a heat element holder 500 with a silicon adhesive, or the like, for example, and then the heat element holder 500 is screwed onto the heat sink 300, so that the heat element 31 comes in contact with and is fixed to the heat sink 300. Further, the heat element 31 includes a plurality of legs, and the legs are soldered onto the substrate 400.

The heat element 31 is composed of a power IC, a system regulator, a regulator, or the like.

Figure 6:
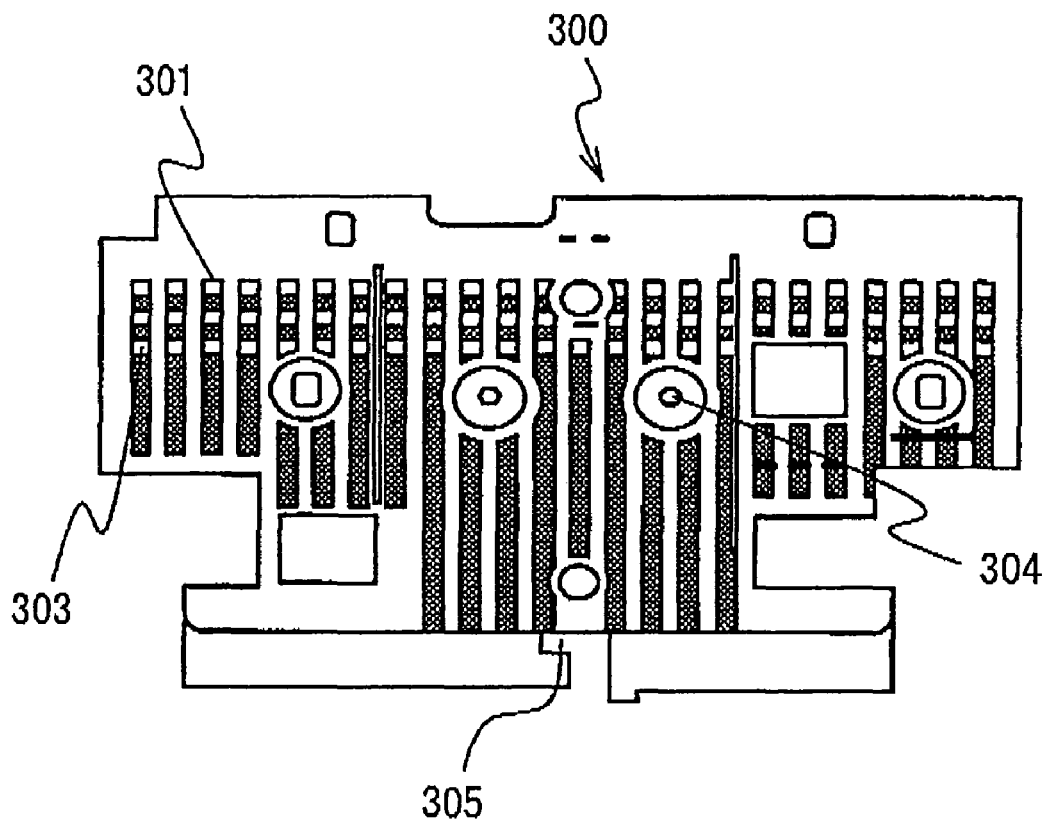
FIG. 6 is a diagram showing the structure of an outside surface of the heat sink, which is directed to an outside direction of a casing.

FIG. 6 is a diagram showing the structure of the outside surface of the heat sink, which is directed to the outside direction of the casing.

As shown in FIG. 6, the heat sink 300 includes: a plurality of groove portions 301 that extend from the lower side of the heat sink 300, which comes in contact with the heat element 31 bonded to the heat element holder 500, toward an upper side of the heat sink 300 in the vertical direction; and a plurality of through-holes 303 that are formed at intersection points of the plurality of groove portions 301, and the plurality of groove portions 302 (see FIG. 7) which are orthogonal to the groove portions 301 on the inside surface of the heat sink 300 and arranged in a horizontal direction. In addition, the heat sink 300 includes: a plurality of threaded holes 304 for screwing up the heat element holder 500; and a through-groove 305 for cable wiring.

The groove portions 301 are formed like slits over the whole on the outside surface of the heat sink 300. The groove portions 301 have functions that expand the surface area on the outside surface of the heat sink 300 and increase the contact area with the air, to thereby improve efficiency of discharging the heat, which is generated from the heat element 31 and transmitted to the outside of the heat sink 300, into the air. Also, the groove portions 301 have functions that upwardly discharge the hot air in high efficiency along themselves formed in the vertical direction. Each of the groove portions 301 adopts a cross-section with a rectangular and concave shape, but the cross-section may be a polygonal shape or a curved surface shape. A width of each of the groove portions 301 decides the surface area on the outside surface of the heat sink 300, and a hole diameter of each of the through-holes 303 formed at the intersection points of the groove portions 301 and the groove portions 302 (see FIG. 7). The width of each of the groove portions 301 can be set in consideration of the requested surface area, an EMC request frequency band of the in-vehicle apparatus, and so on. A depth of each of the groove portions 301 can be set such that it is less than a thickness of the heat sink 300, the sum of the depths of the groove portions 301 and 302 is more than the thickness of heat sink 300, and the through-holes 303 are formed at the intersection points of the groove portions 301 and the groove portions 302.

Although the groove portions 301 in the present embodiment are arranged over the whole on the outside surface of the heat sink 300, the groove portions 301 can be arranged only in the parts where a user wants to improve the cooling efficiency and the heat radiation efficiency especially on the outside surface of the heat sink 300.

The plurality of threaded holes 304 provided on the heat sink 300 are formed at positions corresponding to attaching portions of the heat element holder 500. The through-groove 305 for cable wiring is arranged below the attaching portions of the heat element holder 500. The through-holes 303 will be described later.

Figure 7:
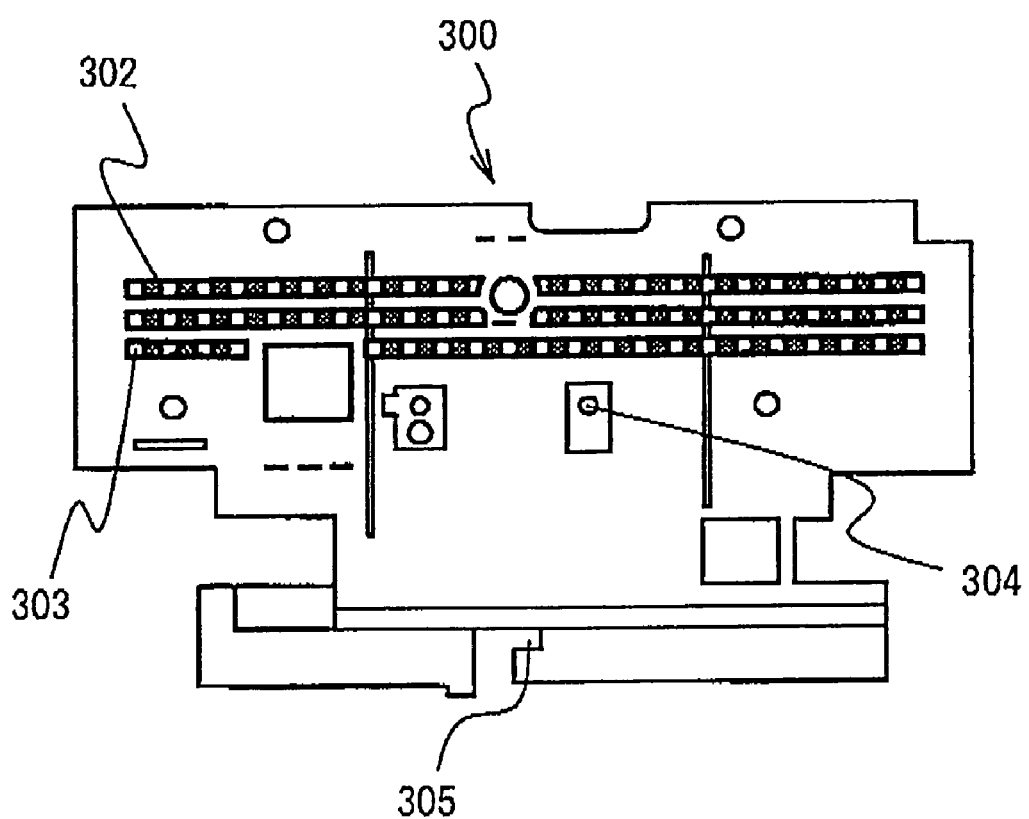
FIG. 7 is a diagram showing the structure of an inside surface of the heat sink, which is directed to an inside direction of the casing.

FIG. 7 is a diagram showing the structure of the inside surface of the heat sink, which is directed to the inside direction of the casing.

As shown in FIG. 7, the inside surface of the heat sink 300 includes: the plurality of groove portions 302 that are in a horizontal direction; and the plurality of through-holes 303 that are formed at the intersection points of the groove portions 301, which are formed in the vertical direction on the outside surface of the heat sink 300, and the groove portions 302. In addition, the inside surface of the heat sink 300 includes: the attaching portions of the heat element holder 500; the plurality of threaded holes 304; and the through-groove 305 for cable wiring.

The groove portions 302 are formed like slits and so as to be orthogonal to the groove portions 301 on the inside surface of the heat sink 300. The groove portions 302 have functions that expand the surface area on the inside surface of the heat sink 300 and increase the contact area with the air in the casing, to thereby absorb the heat which stays in the casing and is generated from the heat element 31, and improve the cooling efficiency inside the casing. Therefore, when the number of provided groove portions 302 is little, it is preferable that the groove portions 302 are arranged at an upper side of the casing where the heat easily stays. The heat sink 300 absorbs the heat which stays inside the casing along the groove portions 302 formed in the horizontal direction, so that the groove portions 302 also have functions that reduce the partial bias of horizontal cooling capabilities, and improve the uniformity of the cooling capabilities. Each of the groove portions 302 adopts a cross-section with a rectangular and concave shape, similarly to the groove portions 301, but the cross-section may be a polygonal shape or a curved surface shape. A depth and a width of each of the groove portions 302 can be set in the same manner as those of each of the groove portions 301.

Although the groove portions 302 in the present embodiment are arranged at the upper side on the inside surface of the heat sink 300, the groove portions 301 can be arranged over the whole on the inside surface of the heat sink 300, or only in the portions where a user wants to improve the cooling efficiency and the heat radiation efficiency especially.

The plurality of through-holes 303 are formed at the intersection points of the groove portions 301 and the groove portions 302. The through-holes 303 have functions that expand the surface area on the outside surface of the heat sink 300 and increase the contact area with the air, to thereby improve efficiency of discharging the heat, which is generated from the heat element 31 and transmitted to the outside of the heat sink 300, into the air. The through-holes 303 are arranged at the upper side on the heat sink 300, so that the through-holes 303 also have functions that discharge the hot air which stays at the upper side in the casing to the outside of the casing in high efficiency. Each of the through-holes 303 provided on the heat sink 300 is formed in rectangle hole shape, and the hole diameter and the size thereof are decided by the shapes, the widths, and the depths of the groove portions 301 and 302. It is preferable that the hole diameter of each of the through-holes 303 formed at the intersection points of the groove portions 301 and the groove portions 302 is set to 5 mm or less, in order to prevent the deterioration of the dust-proof performance, the EMC performance, and the like.

Thus, the groove portions 301 and the through-holes 303 are formed on the outside of the heat sink 300, and the groove portions 302 and the through-holes 303 are formed on the inside of the heat sink 300, to thereby absorb the heat in the casing in high efficiency, and discharge the heat to the outside of the casing efficiently. Also, the groove portions 301 and 302, and the through-holes 303 are formed on the heat sink 300, to thereby reduce the weight of the heat sink 300.

As described above, in the in-vehicle system 1 of the first embodiment, the heat sink 300 provided in the casing includes the groove portions 301 and 302 formed on a first surface and a second surface (i.e., the outside surface and the inside surface), respectively, to thereby improve the cooling efficiency and the heat radiation efficiency in the casing. Also, the heat sink 300 includes the through-holes 303 with reduced diameters formed at the intersection points of the groove portions 301 and the groove portions 301, so that the hot air which is generated from the heat element 31 and stays in the casing can be discharged to the outside of the casing in high efficiency, and the dust-proof performance and the EMC performance can be maintained highly.

Further, in the in-vehicle system 1 of the first embodiment, the groove portions 301 and 302 are arranged in the form of lattices, to thereby reduce the partial bias of the heat radiation capabilities of the heat sink 300, and improve the uniformity of the cooling capabilities. Then, the groove portions 301 on the outside surface of the heat sink 300 extend vertically downward from the upper side of the heat sink 300, to thereby discharge upward the heat transmitted from the heat element 31 to the outside surface of the heat sink 300 along the vertical groove portions 301, and improve the heat radiation efficiency.

Second Embodiment

Figure 8:
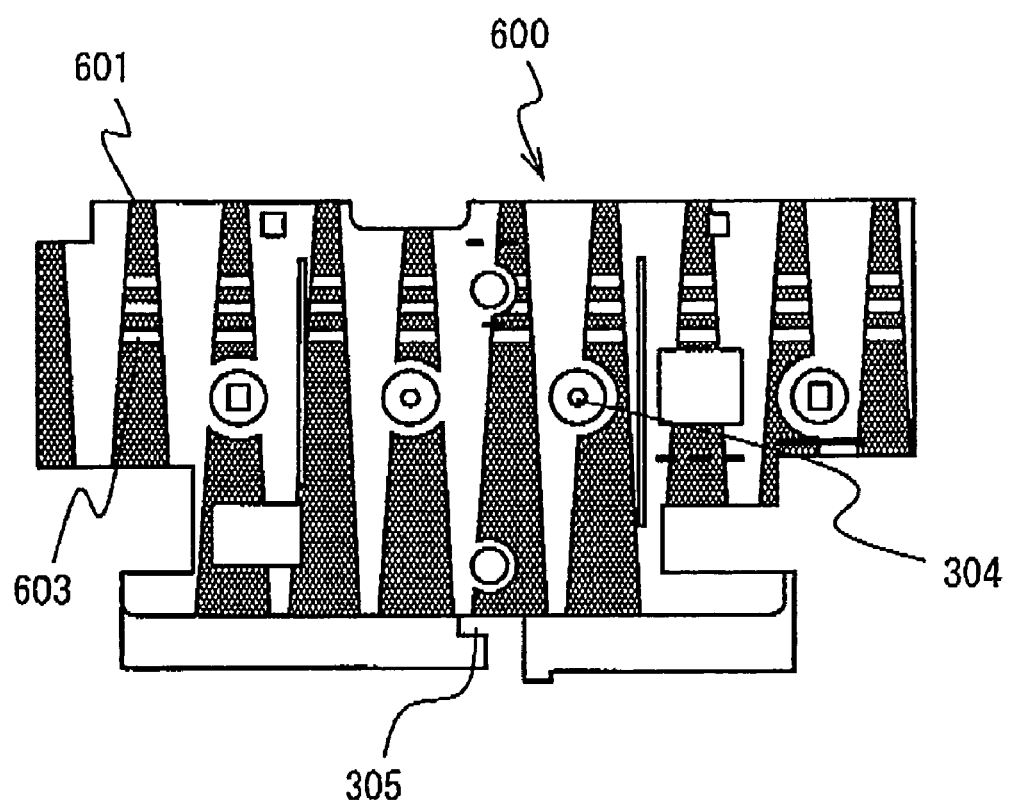
FIG. 8 is a diagram showing the structure of the outside surface of the heat sink, in which a width of each groove portion changes.

Next, a description will now be given of a second embodiment of the present invention. FIG. 8 is a schematic diagram showing the structure of the outside surface of a heat sink 600 installed in the in-vehicle system 1 according to the second embodiment. In FIG. 8, elements corresponding to those in the first embodiment are designated by identical reference numerals, and detailed description of the elements corresponding to those in the first embodiment is omitted.

As shown in FIG. 8, the outside surface of the heat sink 600 in the present embodiment adopts the composition such that the groove portions 601 extend from a lower side of the heat sink 600 which comes in contact with the heat element 31 inside the heat element holder 500, toward an upper side of the heat sink 600 in the vertical direction, and a width of each of the groove portions 601 becomes narrower toward the upper side of the heat sink 600.

The groove portions 601 are formed like slits over the whole on the outside surface of the heat sink 600. The width of each of the groove portions 601 narrows from the lower side of heat sink 600 toward the upper side thereof. Thereby, when the heat air which is generated by the heat element 31 and transmitted to the outside surface of the heat sink 600 rises along the groove portions 601 on the outside surface, the volume of the heat air is pressed by the groove portions 601, and hence the flow velocity of the heat air can increase. It is therefore possible to increase the flow velocity of the heat air which rises along the groove portions 601 of the heat sink 600. As a result, the heat radiation efficiency in the casing can be improved. The ratio between the widths of the lower side and the upper side of each of the groove portions 601 is set according to requested heat radiation efficiency.

Figure 9:
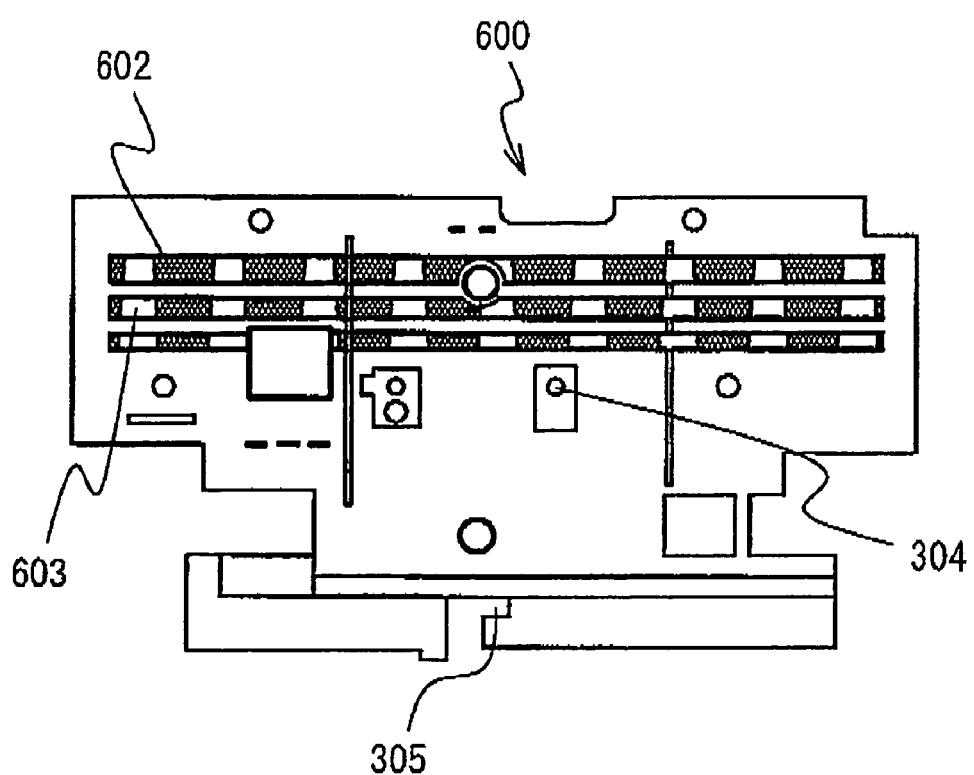
FIG. 9 is a diagram showing the structure of the inside surface of the heat sink, in which a width of each groove portion changes.

The groove portions 602 on the inside surface of the heat sink 600 can be configured in the same manner as the groove portions 302 on the inside surface of the heat sink 300 of the first embodiment, and the width of each of the groove portions 602 can be changed by the arrangement of the groove portions 602. In the heat sink 600 of the present embodiment, the widths of the groove portions 601 on the outside surface become narrower toward the upper side of the groove portions 601, and hence the higher the through-holes 603 are formed, the smaller the horizontal hole diameters thereof become. In this case, as shown in FIG. 9, the groove portions 602 on the inside surface of the heat sink 600 can make the widths of the groove portions 602 wider toward the upper side of the groove portions 602, for example. In such configuration, the vertical hole diameters of the through-holes 603 formed on a more upper side of the heat sink 600 are larger, and hence requested opening areas can be secured with respect to the through-holes 603, formed on the more upper side of the heat sink 600, where horizontal hole diameters become smaller. Therefore, the heat air which stays at the upper side in the casing can be discharged to the outside of the casing in high efficiency. In this case, it is preferable that the widths of the respective groove portions 602 are set so that the opening areas of the through-holes 603 formed on the heat sink 600 are approximately equal to each other.

As described above, in the in-vehicle system 1 of the second embodiment, the heat sink 600 provided in the casing includes the groove portions 601 formed on the outside surface, the groove portions 602 formed on the inside surface, and the through-holes 303 with reduced diameters, to thereby improve the cooling efficiency and the heat radiation efficiency in the casing, and maintain the dust-proof performance and the EMC performance highly. In addition, the width of each of the groove portions 601 on the outside surface becomes narrower toward the upper side of the groove portions 601, to thereby increase the flow velocity of the heat air which rises along the groove portions 601 of the heat sink 600, and improve the heat radiation efficiency in the casing. Therefore, the heat which is generated from the heat element 31 and transmitted to the outside surface of the heat sink 600 can be discharged to the outside of the casing in high efficiency.

Figure 10:
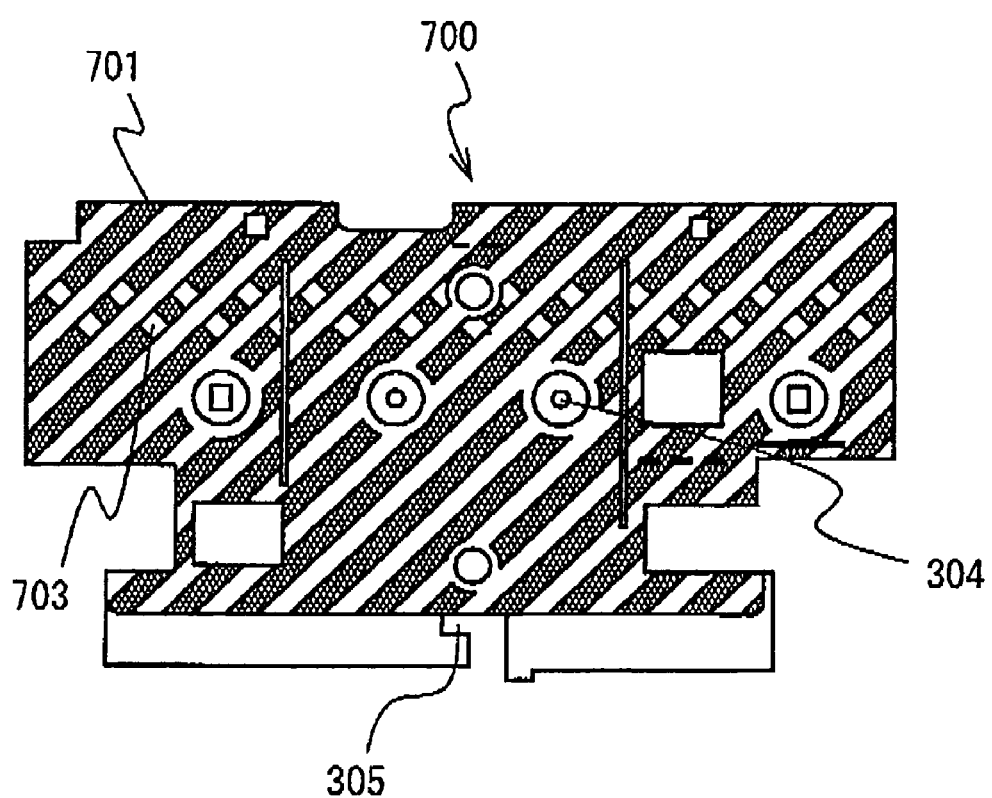
FIG. 10 is a diagram showing the structure of the outside surface of the heat sink, in which each groove portion on the outside surface is formed in a diagonal direction.
Figure 11:
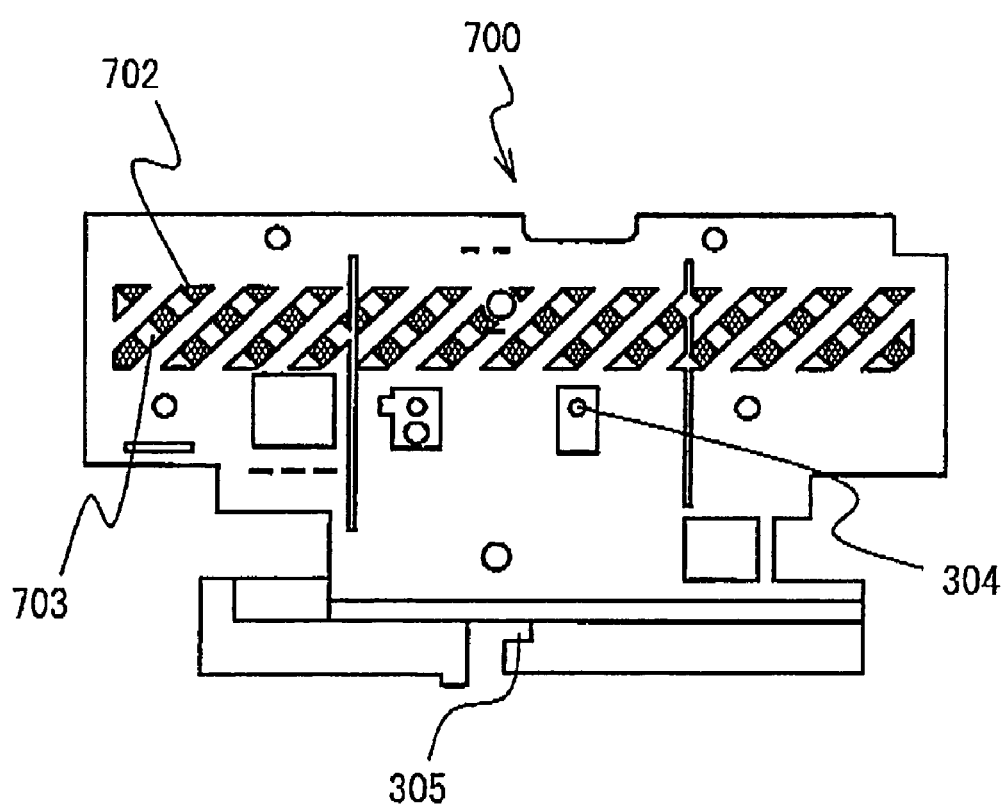
FIG. 11 is a diagram showing the structure of the inside surface of the heat sink, in which each groove portion on the inside surface is formed in a diagonal direction orthogonal to each groove portion on the outside surface.

As a variation example, the heat sink 300 or 600 may be configured like a heat sink 700 as shown in FIGS. 10 and 11. That is, the heat sink 700 may include: a plurality of groove portions 701 that are formed on an outside surface of the heat sink 700 as shown in FIG. 10, and extend from a lower side of the heat sink 700 which comes in contact with the heat element 31 inside the heat element holder 500, toward an upper side of the heat sink 700 in a diagonal direction; a plurality of groove portions 702 that are formed on an inside surface of the heat sink 700 as shown in FIG. 11, and formed in another diagonal direction so as to be orthogonal to the groove portions 701; and a plurality of through-holes 703 that are formed at intersection points of the groove portions 701 and the groove portions 702.

Also, a width of the groove portion 301, 302, 601, 602, 701 or 702 may become narrower toward the upper side of the heat sink 300, 600, or 700. In a single groove portion 301, 302, 601, 602, 701 or 702, the width of a piece of the groove portion 301, 302, 601, 602, 701 or 702 may be widened or narrowed.

The first or second embodiment is only one sample to execute the present invention. The present invention is not limited to the specifically disclosed embodiments, but include other embodiments and variations without departing from the scope of the present invention.

The present application is based on Japanese Patent Application No. 2008-102868 filed Apr. 10, 2008, the entire disclosure of which is hereby incorporated by reference.

What is claimed is:

1. An electronic apparatus in which a circuit substrate is installed in a casing, comprising:
   first and second groove portions that are formed on a first surface and a second surface of a heat sink, respectively, the heat sink discharging heat from a heat element on the circuit substrate to the outside of the casing; and
   a through-hole portion that is formed at an intersection point of the first groove portion formed on the first surface of the heat sink and the second groove portion formed on the second surface of the heat sink, wherein at least one of the widths of the first groove portion and the second groove portion linearly changes from a lower side of the heat sink toward an upper side of the heat sink.

2. The electronic apparatus as claimed in claim 1, wherein the first groove portion and the second groove portion are arranged in the form of a lattice on the heat sink.

3. The electronic apparatus as claimed in claim 1, wherein at least one of the first groove portion and the second groove portion extends vertically downward from the upper side of the heat sink.

4. The electronic apparatus as claimed in claim 2, wherein at least one of the first groove portion and the second groove portion extends substantially vertically downward from the upper side of the heat sink.

5. The electronic apparatus as claimed in claim 1, wherein at least one of the first groove portion and the second groove portion extends vertically downward from the upper side of the heat sink.

6. The electronic apparatus as claimed in claim 1, wherein a sum of the depths of the first groove portion and the second groove portion is more than the thickness of the heat sink.

7. The electronic apparatus as claimed in claim 1, wherein the first groove portion extends from a lower portion of the heat sink toward the upper side of the heat sink in a diagonal direction, and the second groove portion is formed in another diagonal direction so as to be orthogonal to the first groove portion.

8. The electronic apparatus as claimed in claim 1, further comprising a plurality of first groove portions and a plurality of second groove portions,
   wherein the widths of any one of the first groove portions and the second groove portions become narrower toward an upper side of the corresponding first or second groove portions, and the widths of the other of the first groove portions and the second groove portions become wider toward an upper side of the corresponding first or second groove portions.

* * * * *